(12) United States Patent
Goto

(10) Patent No.: US 12,431,379 B2
(45) Date of Patent: Sep. 30, 2025

(54) CERAMIC SUBSTRATE, METHOD OF MANUFACTURING THE CERAMIC SUBSTRATE, ELECTROSTATIC CHUCK, SUBSTRATE FIXING DEVICE, AND PACKAGE FOR SEMICONDUCTOR DEVICE

(71) Applicant: SHINKO ELECTRIC INDUSTRIES CO., LTD., Nagano (JP)

(72) Inventor: Akira Goto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 223 days.

(21) Appl. No.: 18/318,831

(22) Filed: May 17, 2023

(65) Prior Publication Data

US 2023/0377933 A1    Nov. 23, 2023

(30) Foreign Application Priority Data

May 19, 2022    (JP) .................................. 2022-082151

(51) Int. Cl.
| | |
|---|---|
| *H01L 21/683* | (2006.01) |
| *B32B 18/00* | (2006.01) |
| *H01L 23/498* | (2006.01) |
| *H01T 23/00* | (2006.01) |
| *B32B 3/30* | (2006.01) |

(52) U.S. Cl.
CPC .......... *H01L 21/6833* (2013.01); *B32B 18/00* (2013.01); *H01L 23/49822* (2013.01); *H01L 23/49894* (2013.01); *B32B 3/30* (2013.01); *B32B 2264/1023* (2020.08); *B32B 2264/303* (2020.08); *B32B 2457/14* (2013.01)

(58) Field of Classification Search
CPC ........... H01L 21/6833; H01L 23/49822; H01L 23/49894; B32B 18/00
USPC ......................................................... 361/234
See application file for complete search history.

(56) References Cited

U.S. PATENT DOCUMENTS

| | | | |
|---|---|---|---|
| 5,844,153 A * | 12/1998 | Schlatter ................. | C22C 19/07 75/239 |
| 2005/0231887 A1* | 10/2005 | Zandi ................... | H01L 21/6833 361/234 |
| 2016/0336210 A1* | 11/2016 | Cooke ............... | H01L 21/67248 |
| 2020/0075383 A1 | 3/2020 | Minemura | |

FOREIGN PATENT DOCUMENTS

JP    2020-043336 A    3/2020

* cited by examiner

*Primary Examiner* — Sean Kayes
*Assistant Examiner* — Lucy M Thomas
(74) *Attorney, Agent, or Firm* — Rankin, Hill & Clark LLP

(57) ABSTRACT

A ceramic substrate includes a base body and an electrical conductor pattern embedded in the base body. The base body is a ceramic. The electrical conductor pattern has, as a main component, a solid solution having a body-centered cubic lattice structure in which cobalt and iron are solid-dissolved in tungsten, a solid solution in a body-centered cubic lattice structure in which cobalt and silicon are solid-dissolved in tungsten, a solid solution having a body-centered cubic lattice structure in which cobalt and manganese are solid-dissolved in tungsten, or a solid solution having a body-centered cubic lattice structure in which cobalt and nickel are solid-dissolved in tungsten.

12 Claims, 10 Drawing Sheets

CERAMIC SUBSTRATE, METHOD OF MANUFACTURING THE CERAMIC SUBSTRATE, ELECTROSTATIC CHUCK, SUBSTRATE FIXING DEVICE, AND PACKAGE FOR SEMICONDUCTOR DEVICE

CROSS-REFERENCE TO RELATED APPLICATIONS

This application claims priority from Japanese Patent Application No. 2022-082151, filed on May 19, 2022, the entire content of which is incorporated herein by reference.

TECHNICAL FIELD

The present invention relates to a ceramic substrate, a method of manufacturing the ceramic substrate, an electrostatic chuck, a substrate fixing device, and a package for a semiconductor device.

BACKGROUND ART

In the related art, a film formation apparatus and a plasma etching apparatus that are used when manufacturing a semiconductor device each have a stage for accurately holding a wafer in a vacuum treatment chamber. As such a stage, for example, suggested is a substrate fixing device that adsorbs and holds a wafer by an electrostatic chuck mounted on a base plate, for example.

The electrostatic chuck is configured by a ceramic substrate having a base body, an electrostatic electrode embedded in the base body, and the like. The electrostatic electrode is, for example, a sintered body having tungsten as a main component and including nickel oxide, aluminum oxide, and silicon dioxide.

In the sintered body described above, ceramic and tungsten are sintered under the same conditions. However, since tungsten has a high melting point (3300° C. or higher), it is difficult to sinter the same, and therefore, it is needed to add an appropriate sintering aid. In the sintered body described above, nickel oxide, aluminum oxide, and silicon dioxide function as sintering aids (for example, refer to Patent Literature 1).

CITATION LIST

Patent Literature

Patent Literature 1: JP2020-43336A

SUMMARY OF INVENTION

However, among materials that function as sintering aids for sintering tungsten, there are materials that are relatively difficult to obtain. For this reason, it is preferable to have many choices of materials that function as sintering aids, and new sintering aids for sintering tungsten are required.

The present invention has been made in view of the above situations, and an object thereof is to provide a ceramic substrate obtained by sintering an electric conductor pattern including tungsten by using a sintering aid different from that of the related art.

According to an aspect of the present disclosure, there is provided a ceramic substrate including a base body and an electrical conductor pattern embedded in the base body. The base body is a ceramic. The electrical conductor pattern has, as a main component, a solid solution having a body-centered cubic lattice structure in which cobalt and iron are solid-dissolved in tungsten, a solid solution in a body-centered cubic lattice structure in which cobalt and silicon are solid-dissolved in tungsten, a solid solution having a body-centered cubic lattice structure in which cobalt and manganese are solid-dissolved in tungsten, or a solid solution having a body-centered cubic lattice structure in which cobalt and nickel are solid-dissolved in tungsten.

According to the disclosed technology, it is possible to provide the ceramic substrate obtained by sintering the electric conductor pattern including tungsten by using the sintering aid different from that of the related art.

DESCRIPTION OF EMBODIMENTS

Hereinafter, embodiments of the present invention will be described with reference to the drawings. Note that, in the respective drawings, the parts having the same configurations are denoted with the same reference signs, and the overlapping descriptions may be omitted.

First Embodiment

[Structure of Substrate Fixing Device]

Figure 1:
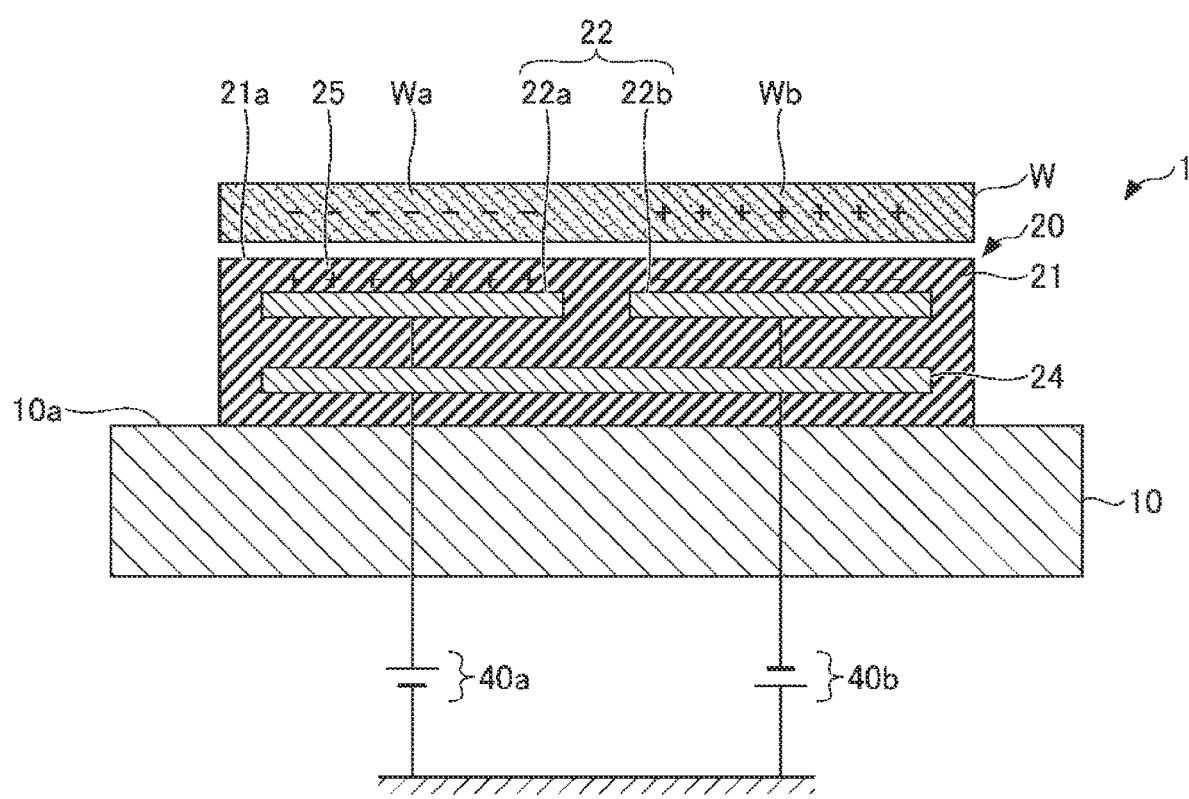
FIG. 1 is a sectional view simplifying and exemplifying a substrate fixing device according to a first embodiment.

FIG. 1 is a sectional view simplifying and exemplifying a substrate fixing device according to a first embodiment. Referring to FIG. 1, a substrate fixing device 1 has, main constitutional elements, a base plate 10, and an electrostatic chuck 20. The substrate fixing device 1 is a device that adsorbs and holds a substrate W (for example, a semiconductor wafer, or the like), which is a target object to be adsorbed, by the electrostatic chuck 20.

The base plate 10 is a member for mounting the electrostatic chuck 20. A thickness of the base plate 10 is, for example, about 20 to 40 mm. The base plate 10 is formed of, for example, a metal material such as aluminum and cemented carbide, a composite material of the metal material and a ceramic material, or the like, and may be used as an electrode or the like for controlling plasma. For example, from standpoints of easy availability, easy processing, favorable thermal conductivity and the like, aluminum or an alloy thereof is used, and the material whose surface has been subjected to an alumite treatment (insulation layer formation) may be favorably used.

For example, by supplying predetermined high-frequency electrical power to the base plate 10, the energy for causing ions and the like in a generated plasma state to collide with the substrate W adsorbed on the electrostatic chuck 20 can be controlled to effectively perform etching processing.

The base plate 10 may be provided therein with a gas supply path for introducing an inert gas for cooling the substrate W adsorbed on the electrostatic chuck 20. When an inert gas such as He or Ar is introduced into the gas supply path from an outside of the substrate fixing device 1 and the inert gas is supplied to a back surface of the substrate W adsorbed on the electrostatic chuck 20, the substrate W can be cooled.

The base plate 10 may be provided therein with a refrigerant flow path. The refrigerant flow path is, for example, a hole formed in an annular shape in the base plate 10. For example, refrigerant such as cooling water and GALDEN is introduced into the refrigerant flow path from an outside of the substrate fixing device 1. By circulating the refrigerant in the refrigerant flow path to cool the base plate 10, it is possible to cool the substrate W adsorbed on the electrostatic chuck 20.

The electrostatic chuck 20 is a part that adsorbs and holds the substrate W that is a target object to be adsorbed. A planar shape of the electrostatic chuck 20 is formed according to a shape of the substrate W, and is circular, for example. A diameter of the wafer that is a target object to be adsorbed of the electrostatic chuck 20, is, for example, 8 inches, 12 inches or 18 inches.

Note that the description 'in a plan view' indicates that a target object is seen from a normal direction of an upper surface 10*a* of the base plate 10, and the description 'planar shape' indicates a shape of the target object as seen from the normal direction of the upper surface 10*a* of the base plate 10.

The electrostatic chuck 20 is provided on the upper surface 10*a* of the base plate 10 via an adhesive layer. The adhesive layer is, for example, a silicone-based adhesive. A thickness of the adhesive layer is, for example, about 0.1 to 2.0 mm. The adhesive layer has effects of bonding the base plate 10 and the electrostatic chuck 20 and reducing stress that is caused due to a difference in thermal expansion coefficient between the ceramic electrostatic chuck 20 and the aluminum base plate 10. Note that the electrostatic chuck 20 may also be fixed to the base plate 10 by screws.

The electrostatic chuck 20 is a ceramic substrate having, main constitutional elements, a base body 21, an electrostatic electrode 22, and a heat-generating element 24. An upper surface of the base body 21 is a placement surface 21*a* on which a target object to be adsorbed is placed. The electrostatic chuck 20 is, for example, a Johnsen-Rahbeck type electrostatic chuck. However, the electrostatic chuck 20 may also be a Coulomb-type electrostatic chuck.

The base body 21 is a dielectric body. A thickness of the base body 21 is, for example, about 5 to 10 mm, and a relative permittivity (1 kHz) of the base body 21 is, for example, about 9 to 10. The base body 21 is a ceramic composed of, for example, aluminum oxide ($Al_2O_3$), aluminum nitride (AlN), yttrium aluminum garnet (YAG), or the like, as a main component. Here, the main component means a component that accounts for 50 wt. % or more of total materials constituting the base body 21. Among these, it is preferable to use a ceramic composed of aluminum oxide, which is easy to sinter, is relatively low-cost, and has a high electrical resistance. Here, "ceramic composed of aluminum oxide" refers to ceramic to which an inorganic component other than aluminum oxide is not added.

The base body 21 preferably has a purity of the aluminum oxide of 99.5% or higher. The purity of 99.5% or higher indicates that a sintering aid is not added. In addition, the purity of 99.5% or higher means that unintended impurities may be included during a manufacturing process and the like. The base body 21 preferably has a relative density of 97% or greater with respect to the aluminum oxide. The base body 21 preferably has an average particle diameter of the aluminum oxide of 1.0 µm or greater and 3.0 µm or smaller.

The electrostatic electrode 22 is a thin film electrode formed by an electric conductor pattern, and is embedded in the base body 21. In the present embodiment, the electrostatic electrode 22 is a double-electrode type, and has a first electrostatic electrode 22*a* and a second electrostatic electrode 22*b*. Note that, as the electrostatic electrode 22, a single-electrode type consisting of one electrostatic electrode may also be used.

The electrostatic electrode 22 has, as a main component, a solid solution having a body-centered cubic lattice structure in which cobalt and iron are solid-dissolved in tungsten, for example. The electrostatic electrode 22 may have, as a main component, a solid solution having a body-centered cubic lattice structure in which cobalt and silicon are solid-dissolved in tungsten. The electrostatic electrode 22 may have, as a main component, a solid solution having a body-centered cubic lattice structure in which cobalt and manganese are solid-dissolved in tungsten. The electrostatic electrode 22 may have, as a main component, a solid solution having a body-centered cubic lattice structure in which cobalt and nickel are solid-dissolved in tungsten.

Here, the main component means a component that accounts for 50 wt. % or more of total materials constituting the electrostatic electrode 22. In the electrostatic electrode 22, a ratio of each of cobalt and iron to tungsten is preferably 0.05 wt. % or greater and 10 wt. % or less. The case of cobalt and silicon, cobalt and manganese, or cobalt and nickel is also similar, and the ratio of each to tungsten is preferably 0.05 wt. % or greater and 10 wt. % or less.

The first electrostatic electrode 22*a* is connected to a positive electrode side of a power supply 40*a* provided outside the substrate fixing device 1. In addition, the second electrostatic electrode 22*b* is connected to a negative electrode side of a power supply 40*b* provided outside the substrate fixing device 1. A negative electrode side of the power supply 40*a* and a positive electrode side of the power supply 40*b* are connected outside the substrate fixing device 1, and a connection point becomes a ground potential.

A positive (+) voltage is applied to the first electrostatic electrode 22*a* from the power supply 40*a*, and a negative (−) voltage is applied to the second electrostatic electrode 22*b* from the power supply 40*b*. Thereby, positive (+) charges are charged on the first electrostatic electrode 22*a* and negative (−) charges are charged on the second electrostatic electrode 22*b*. Along with this, negative (−) charges are induced in a part Wa of the substrate W corresponding to the first electrostatic electrode 22*a*, and positive (+) charges are induced in a part Wb of the substrate W corresponding to the second electrostatic electrode 22*b*.

When the substrate W, the electrostatic electrode 22 and a ceramic part 25 of the electrostatic chuck 20 (base body 21) arranged therebetween are regarded as capacitors, the ceramic part 25 corresponds to a dielectric layer. Then, the substrate W is electrostatically adsorbed on the electrostatic chuck 20 by a Coulomb's force generated between the electrostatic electrode 22 and the substrate W via the ceramic part 25. The higher the voltage applied to the electrostatic electrode 22 is, the stronger the adsorption holding force is.

The heat-generating element 24 is a heater that is embedded in the base body 21 and generates heat as a current flows therethrough, thereby heating a placement surface 21*a* of the base body 21 to a predetermined temperature. The heat-generating element 24 is arranged on a lower side (base plate 10 side) of the first electrostatic electrode 22*a* and the second electrostatic electrode 22*b*. The heat-generating element 24 is an electrical conductor formed into a film shape. The heat-generating element 24 is provided as a plurality of heater electrodes capable of independently heating and controlling a plurality of regions (heater zones) in a plane of the base body 21.

Note that the heat-generating element 24 may be provided as one heater electrode. The heat-generating element 24 has, as a main component, for example, a solid solution having a body-centered cubic lattice structure in which cobalt and iron are solid-dissolved in tungsten, a solid solution having a body-centered cubic lattice structure in which cobalt and silicon are solid-dissolved in tungsten, a solid solution having a body-centered cubic lattice structure in which cobalt and manganese are solid-dissolved in tungsten, or a solid solution having a body-centered cubic lattice structure in which cobalt and nickel are solid-dissolved in tungsten.

When current is supplied to the heat-generating element 24 from a power supply provided outside the substrate fixing device 1, the heat-generating element 24 generates heat, and therefore, the electrostatic chuck 20 is heated. The substrate W is controlled to a predetermined temperature by the temperature of the electrostatic chuck 20. The heating temperature of the electrostatic chuck 20 is set within the range of 50° C. to 200° C., for example, to 150° C.

Figure 2:
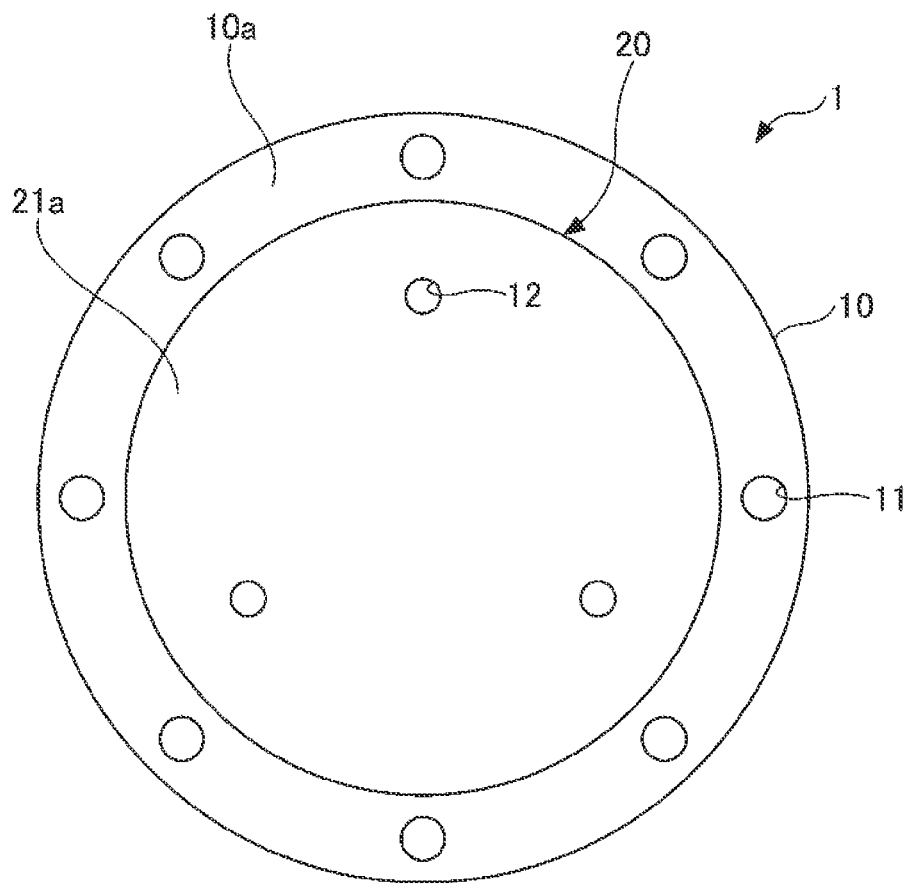
FIG. 2 is a plan view simplifying and exemplifying the substrate fixing device according to the first embodiment.

FIG. 2 is a plan view simplifying and exemplifying the substrate fixing device according to the first embodiment. Referring to FIG. 2, in the substrate fixing device 1, the electrostatic chuck 20 is arranged on the disk-shaped base plate 10, and a peripheral edge portion of the base plate 10 is exposed around the electrostatic chuck 20. Attachment holes 11 for attaching the substrate fixing device to a chamber of a semiconductor manufacturing apparatus are formed in the peripheral edge portion of the base plate 10 to be aligned along the peripheral edge portion.

In addition, each of the electrostatic chuck 20 and the base plate 10 has a plurality of (three, in FIG. 2) opening portions 12 for lift pins in a central portion thereof. Lift pins for moving the substrate W in an upper and lower direction are inserted into the opening portions 12 for lift pins. When the substrate W is moved up from the placement surface 21*a* by the lift pins, the substrate W can be automatically conveyed by a conveyor device.

[Method of Manufacturing Electrostatic Chuck]

Next, a method of manufacturing the electrostatic chuck 20 will be described. FIGS. 3A to 3C and 4A to 4C are perspective views exemplifying a process of manufacturing the electrostatic chuck according to the first embodiment.

Figure 3A:
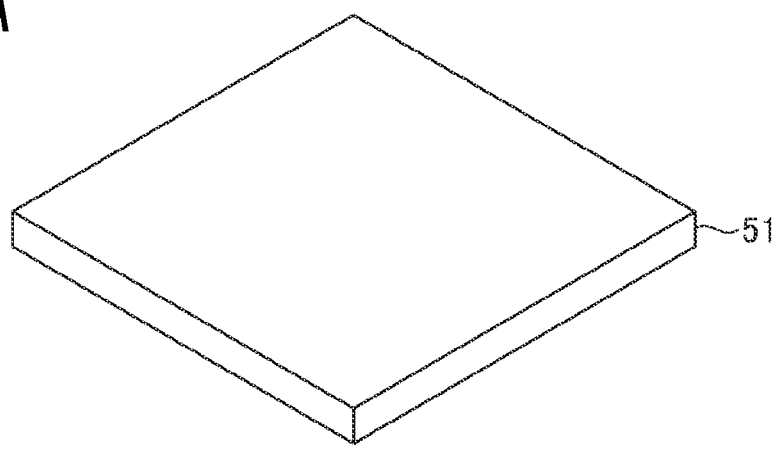
FIGS. 3A, 3B, and 3C are perspective views (part 1) exemplifying a manufacturing process of an electrostatic chuck according to the first embodiment.

First, as shown in FIG. 3A, a green sheet 51 composed of a ceramic material and an organic material is prepared. The green sheet 51 is formed into a shape of a rectangular plate, for example. The ceramic material of the green sheet 51 is composed of aluminum oxide and does not include a sintering aid. The organic component is removed from the green sheet 51, and the ceramic material is sintered and densified, so that the green sheet 51 becomes the base body 21 of a part where the substrate W shown in FIG. 1 is mounted.

Figure 3B:
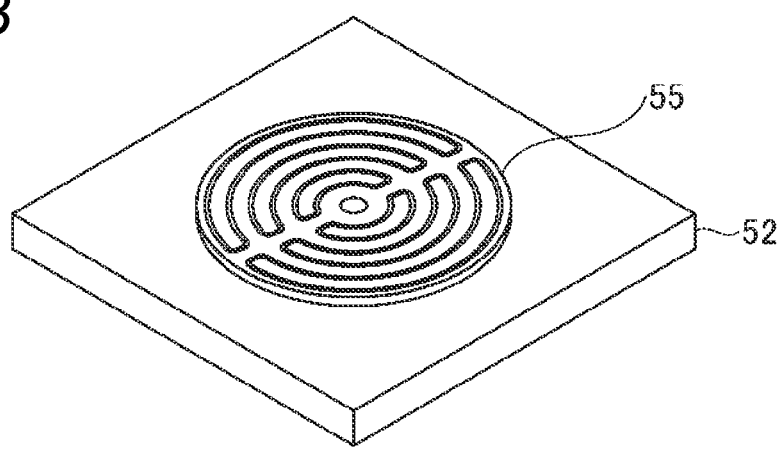

Next, as shown in FIG. 3B, a green sheet 52 composed of a similar material and having a similar shape to those of the green sheet 51 is prepared, and an electrically conductive paste is printed on an upper surface of the green sheet 52 by, for example, a printing method (screen printing), thereby forming an electrical conductor pattern 55. The electrical conductor pattern 55 is fired in a process described later to be the electrostatic electrode 22 shown in FIG. 1A. Note that the electrical conductor pattern 55 may also be formed on a lower surface of the green sheet 51.

For the formation of the electric conductor pattern 55, an electrically conductive paste in which cobalt oxide and iron oxide are added to tungsten, an electrically conductive paste in which cobalt oxide and silica are added to tungsten, an electrically conductive paste in which cobalt oxide and manganese oxide are added to tungsten, or an electrically conductive paste in which cobalt oxide and nickel oxide are added to tungsten is used. The electrically conductive paste that is used for the formation of the electrical conductor pattern 55 may further include an organic material or the like.

An addition amount of each of cobalt oxide and iron oxide is preferably 0.1 g or more and 10 g or less with respect to 100 g of tungsten, for example. That is, in the electrically conductive paste, a ratio of each of cobalt oxide and iron oxide to tungsten is preferably 0.1 wt. % or greater and 10 wt. % or less. When the ratio of each of cobalt oxide and iron oxide to tungsten is 0.1 wt. % or greater, the liquefaction temperature of the electrically conductive paste can be set to about 1360° C. to 1400° C. The case of cobalt oxide and silica, cobalt oxide and manganese oxide, or cobalt oxide and nickel oxide is also similar, and the ratio of each to tungsten is preferably 0.1 wt. % or greater and 10 wt. % or less.

Even when the ratio of each of cobalt oxide and iron oxide, cobalt oxide and silica, cobalt oxide and manganese oxide, or cobalt oxide and nickel oxide to tungsten is greater than 10 wt. %, the liquefaction temperature of the electrically conductive paste will still be about 1360° C. to 1400° C. However, when the ratio of each of cobalt oxide and iron oxide, cobalt oxide and silica, cobalt oxide and manganese oxide, or cobalt oxide and nickel oxide to tungsten is greater than 10 wt. %, the electrical characteristics of tungsten are difficult to be exhibited in a solid solution containing tungsten produced by sintering the electrically conductive paste. For this reason, the ratio of each of cobalt oxide and iron oxide, cobalt oxide and silica, cobalt oxide and manganese oxide, or cobalt oxide and nickel oxide to tungsten is preferably 10 wt. % or less. Note that, in co-firing the electrically conductive paste and the green sheet, an average particle diameter of tungsten is preferably 0.5 μm or greater and 3.0 μm or smaller.

Figure 3C:
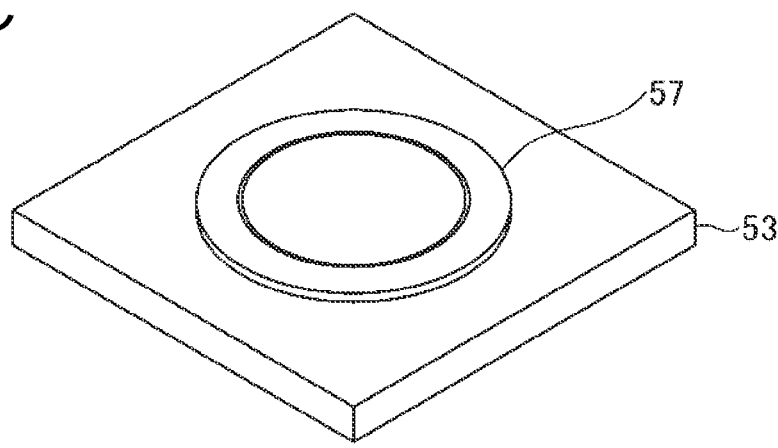

Next, as shown in FIG. 3C, a green sheet 53 composed of a similar material and having a similar shape to those of the green sheet 51 is prepared, and an electrically conductive paste is printed on an upper surface of the green sheet 53 by, for example, a printing method (screen printing), thereby forming an electrical conductor pattern 57. For the electrically conductive paste for forming the electrical conductor pattern 57, an electrically conductive paste composed of the same material as the electrically conductive paste for forming the electrical conductor pattern 55 described above may be used. The green sheet 53 is for forming the heat-generating element 24 shown in FIG. 1 by being fired, and becomes the base body 21 of a part to be bonded to the base plate 10. The electrical conductor pattern 57 is fired in a process described later to be the heat-generating element 24. Note that the electrical conductor pattern 57 may also be formed on a lower surface of the green sheet 52.

Figure 4A:
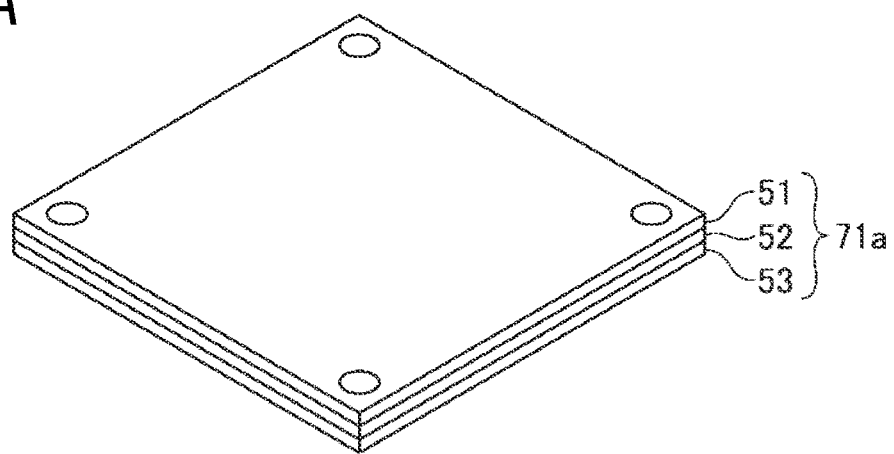
FIGS. 4A, 4B, and 4C are perspective views (part 2) exemplifying the manufacturing process of an electrostatic chuck according to the first embodiment.

Next, as shown in FIG. 4A, each of the green sheets 51 to 53 is laminated to form a structure 71a. The green sheets 51 and 53 are bonded to one another by pressurizing the green sheets while heating the same. Next, as shown in FIG. 4B, a periphery of the structure 71a is cut to form a disk-shaped structure 71b.

Figure 4B:
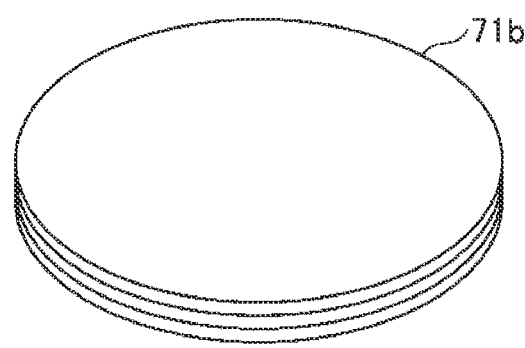
Figure 4C:
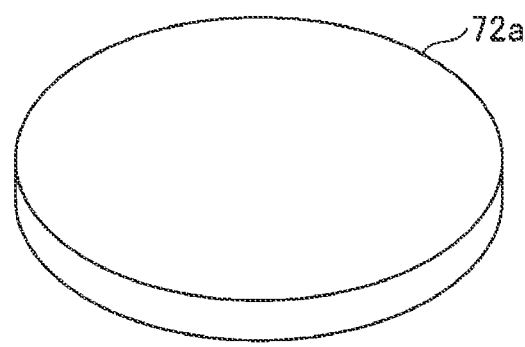

Next, the structure 71b shown in FIG. 4B is fired to obtain a ceramic substrate 72a shown in FIG. 4C. The temperature at the time of firing is, for example, 1600° C. In this process, the electrostatic electrode 22 is obtained by sintering the electrical conductor pattern 55, and the heat-generating element 24 is obtained by sintering the electrical conductor pattern 57. Since the liquefaction temperature of the electrically conductive paste in which cobalt oxide and iron oxide, cobalt oxide and silica, cobalt oxide and manganese oxide, or cobalt oxide and nickel oxide are added to tungsten is about 1360° C. to 1400° C., they are easily sintered at the temperature (e.g., 1600° C.) at the time of firing the ceramic substrate 72a. This forms the electrostatic electrode 22 and the heat-generating element 24 each having, as a main component, a solid solution having a body-centered cubic lattice structure in which copper and iron, cobalt and silicon, cobalt and manganese or cobalt and nickel are solid-dissolved in tungsten.

Next, various processing is performed on the ceramic substrate 72a to complete the electrostatic chuck 20. For example, the upper and lower surfaces of the ceramic substrate 72a are polished to form a placement surface and an adhesive surface. Further, the opening portions 12 for lift pins shown in FIG. 1 are formed in the ceramic substrate 72a.

Below, the present invention will be described in more detail with reference to Examples, but the present invention is not limited to the Examples at all.

[Examination of Liquefaction Temperature]

Next, as Example 1, the liquefaction temperature when 1 g of cobalt oxide and 1 g of iron oxide were added to 100 g of tungsten, which was then adjusted in an atmosphere of nitrogen and hydrogen, was computed by Fact Sage (available from Computational Mechanics Research Center Co., Ltd.). Note that Fact Sage is software that quantitatively predicts the thermodynamic equilibrium state of a multicomponent system.

Figure 5A:
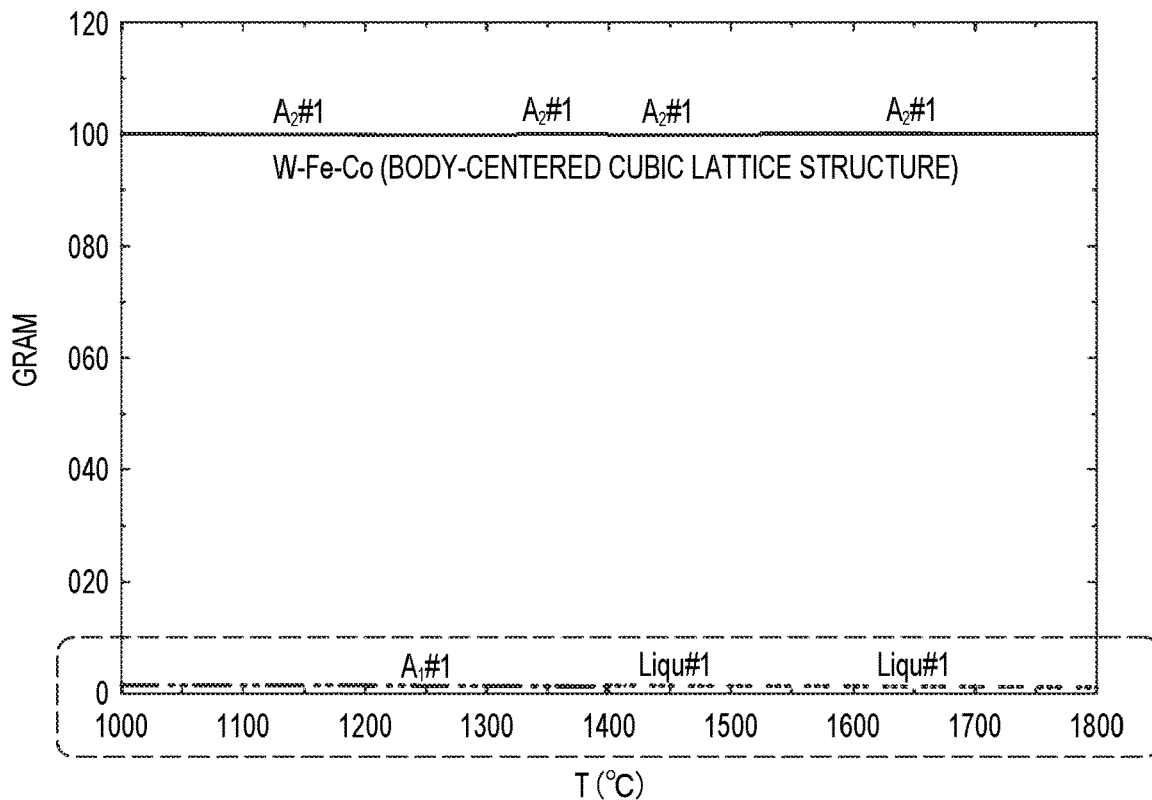
FIGS. 5A and 5B show examination results of the liquefaction temperature of Example 1.
Figure 5B:
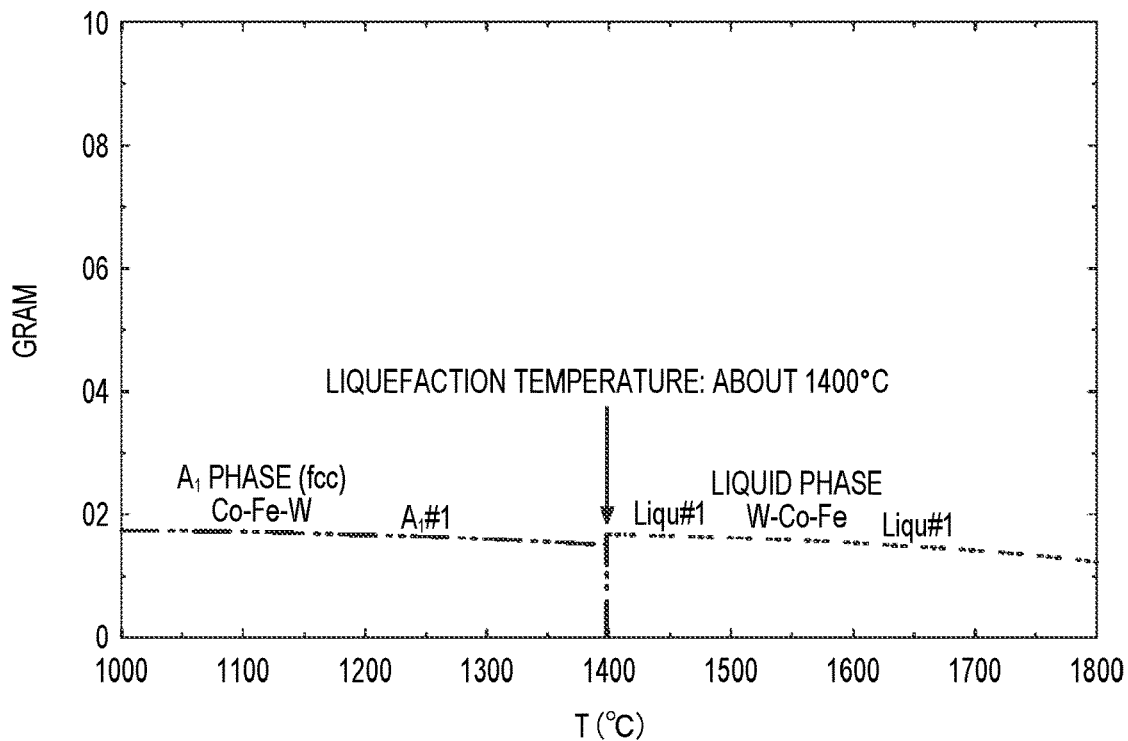

A calculation result of Example 1 is shown in FIGS. 5A and 5B. Note that FIG. 5B is an enlarged view of a portion surrounded by a broken line in FIG. 5A. As shown in FIGS. 5A and 5B, it was confirmed by computation that a solid solution having a body-centered cubic lattice structure in which cobalt and iron were solid-dissolved in tungsten was formed by sintering the material according to Example 1. In addition, in Example 1, the liquefaction temperature was about 1400° C.

Next, as Example 2, the liquefaction temperature when 1 g of cobalt oxide and 1 g of silica were added to 100 g of tungsten, which was then adjusted in an atmosphere of nitrogen and hydrogen, was computed by Fact Sage.

Figure 6A:
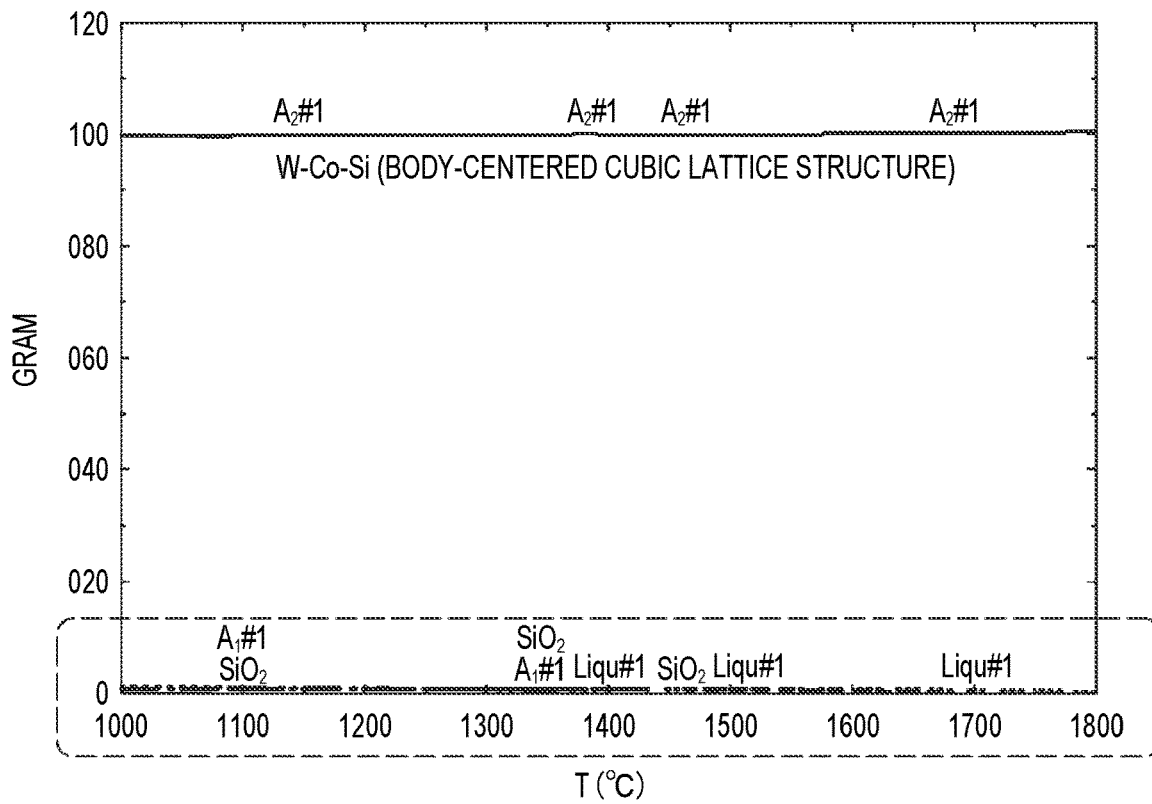
FIGS. 6A and 6B show examination results of the liquefaction temperature of Example 2.
Figure 6B:
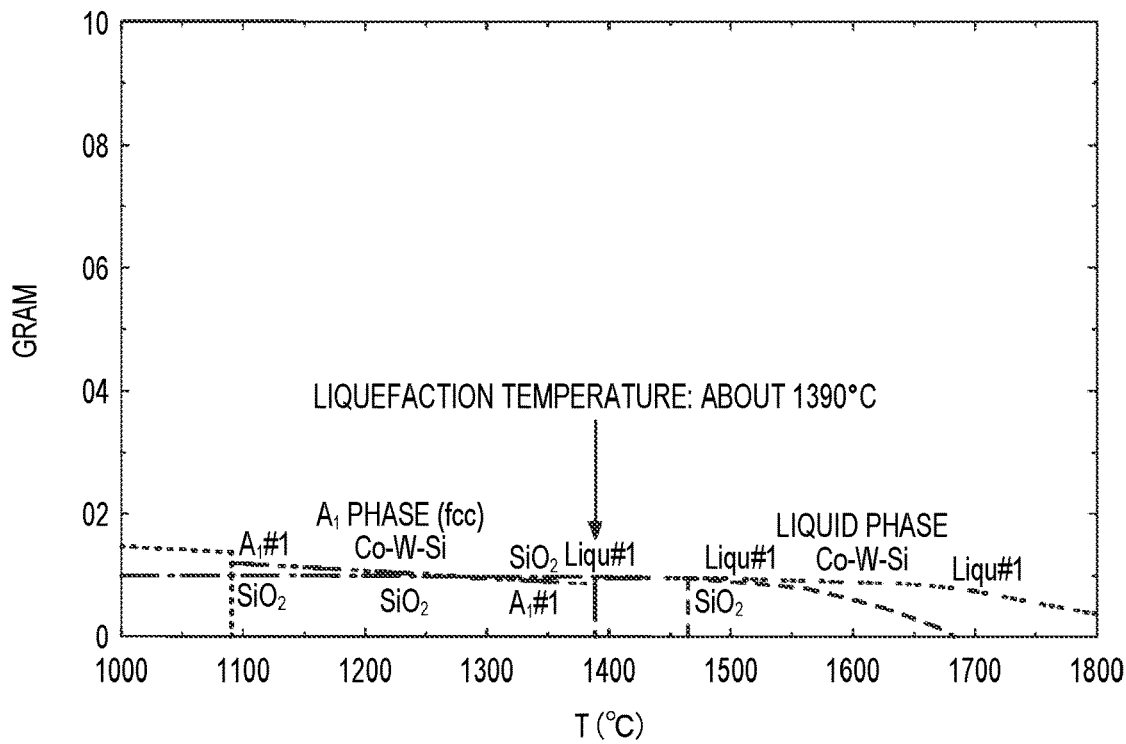

A calculation result of Example 2 is shown in FIGS. 6A and 6B. Note that FIG. 6B is an enlarged view of a portion surrounded by a broken line in FIG. 6A. As shown in FIGS. 6A and 6B, it was confirmed by computation that a solid solution having a body-centered cubic lattice structure in which cobalt and silicon were solid-dissolved in tungsten was formed by sintering the material according to Example 2. In addition, in Example 2, the liquefaction temperature was about 1390° C.

Next, as Example 3, the liquefaction temperature when 1 g of cobalt oxide and 1 g of manganese oxide were added to 100 g of tungsten, which was then adjusted in an atmosphere of nitrogen and hydrogen, was computed by Fact Sage.

Figure 7A:
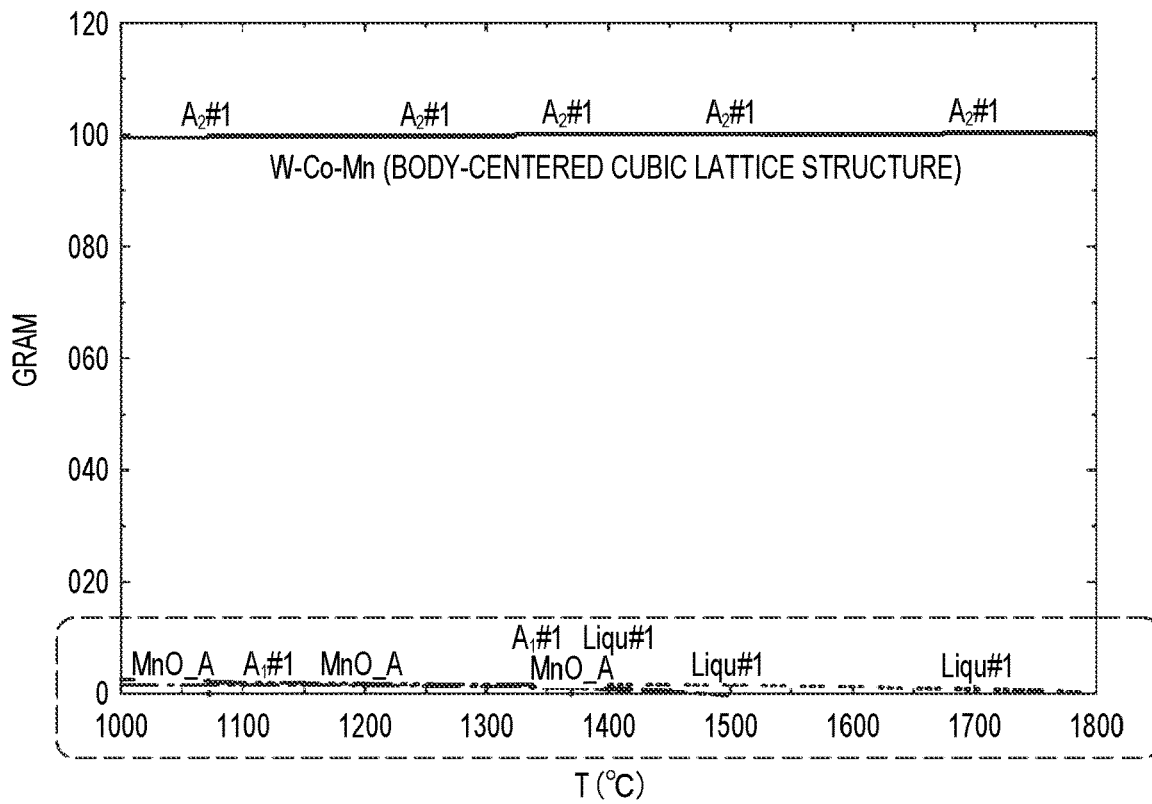
FIGS. 7A and 7B show examination results of the liquefaction temperature of Example 3.
Figure 7B:
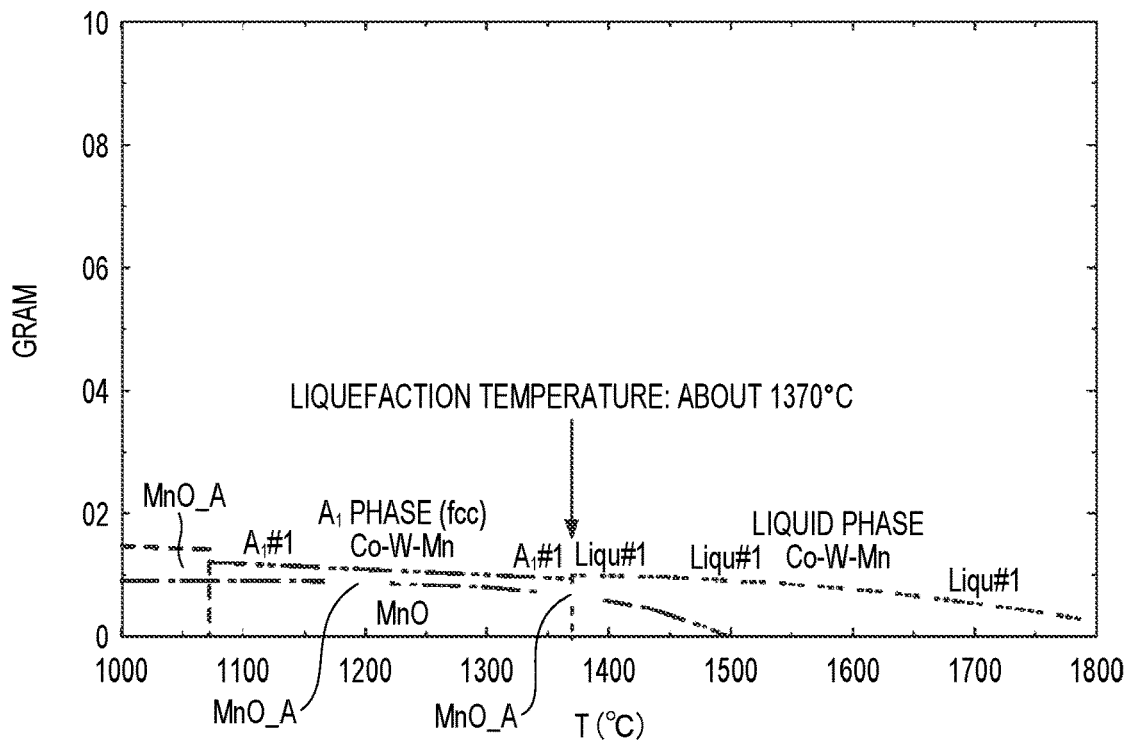

A calculation result of Example 3 is shown in FIGS. 7A and 7B. Note that FIG. 7B is an enlarged view of a portion surrounded by a broken line in FIG. 7A. As shown in FIGS. 7A and 7B, it was confirmed by computation that a solid solution having a body-centered cubic lattice structure in which cobalt and manganese were solid-dissolved in tungsten was formed by sintering the material according to Example 3. In addition, in Example 3, the liquefaction temperature was about 1370° C.

Next, as Example 4, the liquefaction temperature when 1 g of cobalt oxide and 1 g of nickel oxide were added to 100 g of tungsten, which was then adjusted in an atmosphere of nitrogen and hydrogen, was computed by Fact Sage.

Figure 8A:
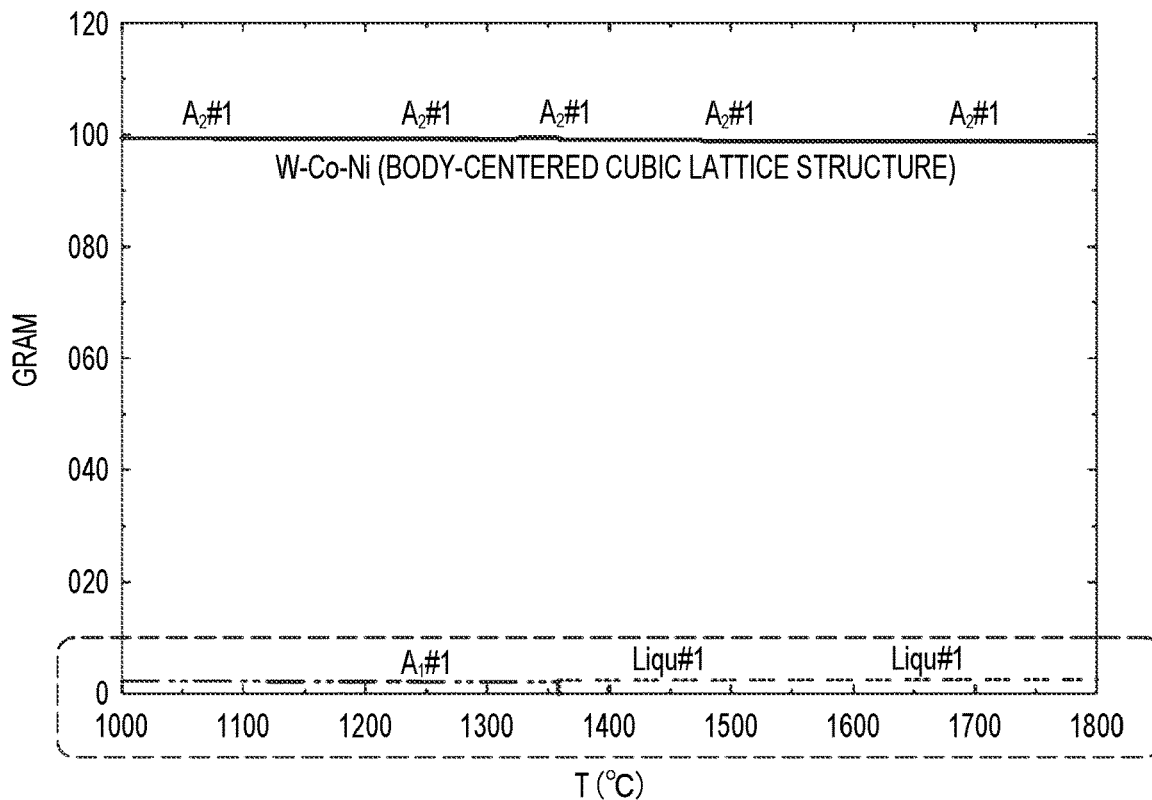
FIGS. 8A and 8B show examination results of the liquefaction temperature of Example 4.
Figure 8B:
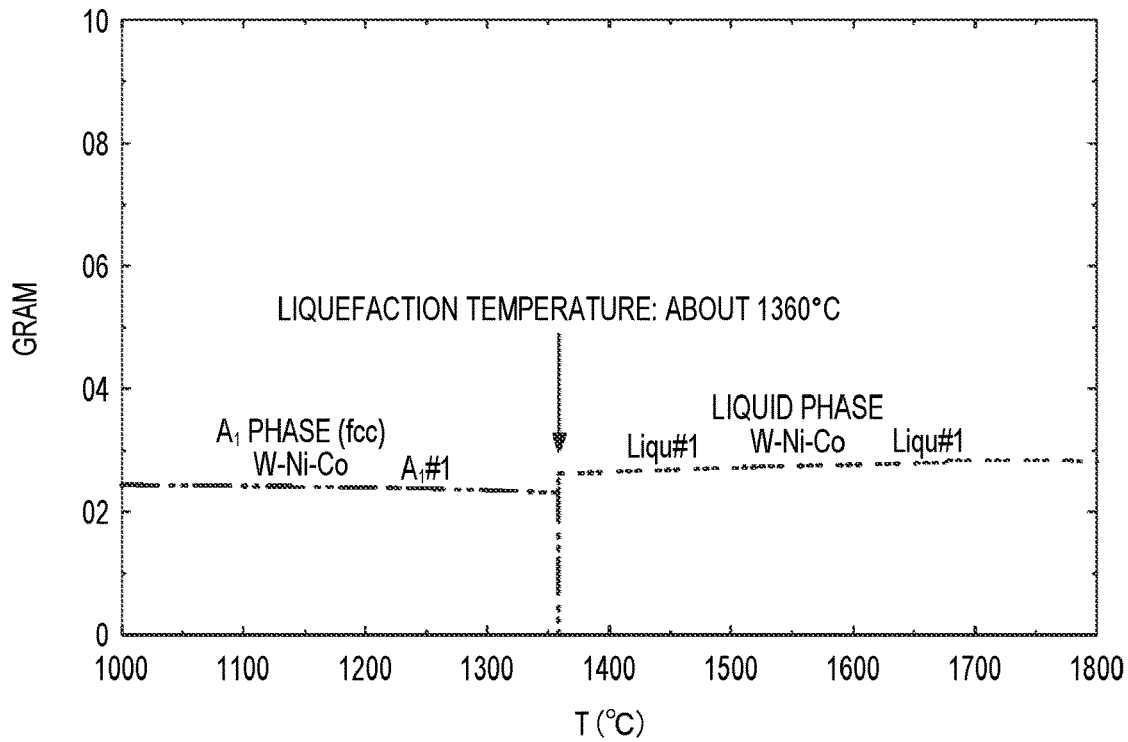

A calculation result of Example 4 is shown in FIGS. 8A and 8B. Note that FIG. 8B is an enlarged view of a portion surrounded by a broken line in FIG. 8A. As shown in FIGS. 8A and 8B, it was confirmed by computation that a solid solution having a body-centered cubic lattice structure in which cobalt and nickel were solid-dissolved in tungsten was formed by sintering the material according to Example 4. In addition, in Example 4, the liquefaction temperature was about 1360° C.

In this way, when cobalt oxide and iron oxide, cobalt oxide and silica, cobalt oxide and manganese oxide, or cobalt oxide and nickel oxide are added to tungsten and fired, the liquefaction temperature can be set to about 1360° C. to 1400° C. Since this temperature is sufficiently lower than the melting point of tungsten (3300° C. or higher) and is also lower than the sintering temperature of the base body (e.g., about 1500° C. to 1600° C.), tungsten can be easily sintered.

That is, cobalt oxide and iron oxide, cobalt oxide and silica, cobalt oxide and manganese oxide, and cobalt oxide and nickel oxide are useful as sintering aids different from the conventional sintering aids used when sintering an electric conductor pattern including tungsten in a ceramic substrate.

Second Embodiment

Figure 9:
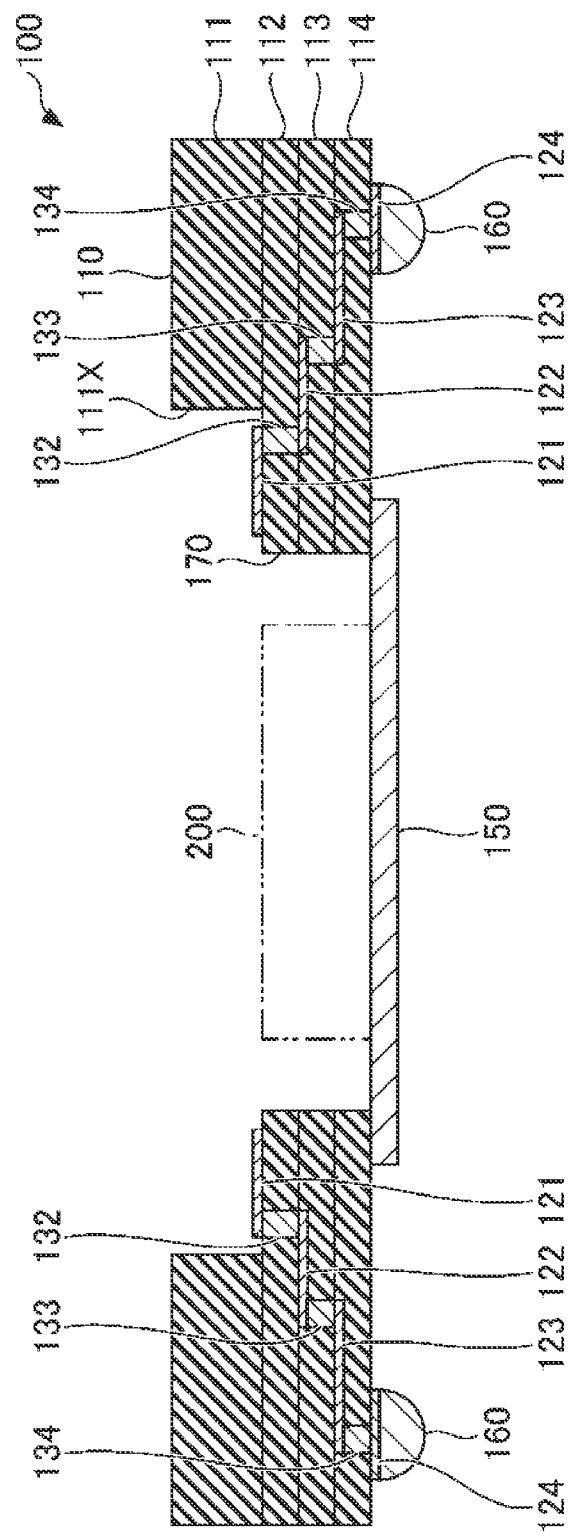
FIG. 9 is a sectional view exemplifying a package for a semiconductor device according to a second embodiment.
Figure 10:
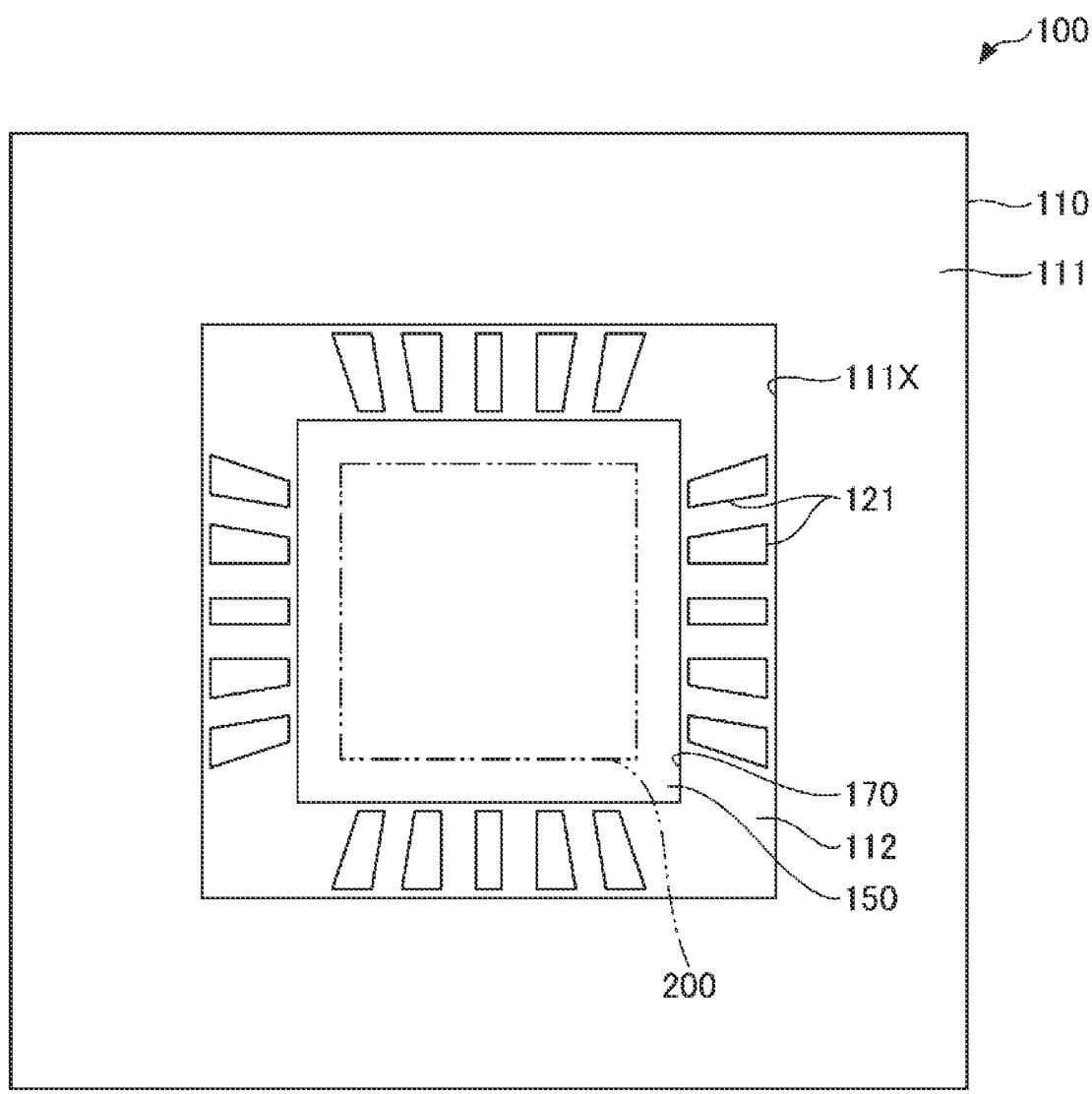
FIG. 10 is a plan view exemplifying the package for a semiconductor device according to the second embodiment.

In a second embodiment, an example of a package for a semiconductor device having the ceramic substrate described in the first embodiment is shown. FIG. 9 is a sectional view exemplifying a package for a semiconductor device according to a second embodiment. FIG. 10 is a plan view exemplifying the package for a semiconductor device according to the second embodiment.

As shown in FIG. 9, a package 100 for a semiconductor device includes a ceramic substrate 110, a heat-dissipating plate 150, and an external connection terminal 160, and the heat-dissipating plate 150 is soldered to the ceramic substrate 110.

The ceramic substrate 110 includes a plurality of (four in the present embodiment) laminated ceramic base materials 111, 112, 113 and 114, wiring patterns 121, 122, 123 and 124 as examples of an electrical conductor pattern, and vias 132, 133 and 134 penetrating through the ceramic base material 112, 113 and 114. The via 132 connects the wiring patterns 121 and 122 each other, the via 133 connects the wiring patterns 122 and 123 each other, and the via 134 connects the wiring patterns 123 and 124 each other. In the ceramic substrate 110, the ceramic base materials 111 to 114 constitute a base body.

As shown in FIGS. 8 and 9, the ceramic substrate 110 has a cavity 170 penetrating through central parts of the ceramic base materials 112, 113 and 114 and for mounting a semiconductor element 200. The wiring pattern 121 is disposed on an upper surface of the ceramic base material 112 in order to surround the cavity 170. An opening portion 111X that exposes the wiring pattern 121 is formed in the ceramic base material 111.

The ceramic base materials 111 to 114 are ceramics composed of aluminum oxide, and the wiring patterns 121 to 124 each have, as a main component, a solid solution having a body-centered cubic lattice structure in which cobalt and iron, cobalt and silicon, cobalt and manganese or cobalt and nickel are solid-dissolved in tungsten. In addition, the vias 132 to 134 are each a fired body having molybdenum as a main component and including nickel oxide, aluminum oxide, and silicon dioxide, for example. Further, the ceramic substrate 110 may be manufactured by a manufacturing method similar to that of the electrostatic chuck 20 of the first embodiment.

In the package 100 for a semiconductor device, the semiconductor element 200 is mounted on the heat-dissipating plate 150. A pad of the semiconductor element 200 is electrically connected to the wiring pattern 121 of the ceramic substrate 110 by a bonding wire or the like. In this way, the semiconductor element 200 is connected to the external connection terminal 160 via the wiring patterns 121 to 124 and the vias 132 to 134.

In the package 100 for a semiconductor device, the wiring patterns 121 to 124 can be formed by sintering an electrically conductive paste in which cobalt oxide and iron oxide are added to tungsten, an electrically conductive paste in which cobalt oxide and silica are added to tungsten, an electrically conductive paste in which cobalt oxide and manganese oxide are added to tungsten, or an electrically conductive paste in which cobalt oxide and nickel oxide are added to tungsten. Thereby, similarly to the first embodiment, tungsten can be easily sintered.

Although the preferred embodiments and the like have been described in detail, the present invention is not limited to the above-described embodiments and the like, and a variety of changes and replacements can be made for the above-described embodiments and the like without departing from the scope defined in the claims.

For example, in the first embodiment, the members included in the substrate fixing device or the layout thereof may be appropriately changed.

In addition, in the first embodiment, the heat-generating element 24 may be disposed between the electrostatic chuck 20 and the base plate 10. In addition, the heat-generating element 24 may be provided in the base plate 10. Further, the heat-generating element 24 may be externally mounted below the electrostatic chuck.

Further, the substrate fixing device according to the first embodiment is applied to a semiconductor manufacturing apparatus, such as a dry etching apparatus (for example, a parallel flat plate type reactive ion etching (RIE) apparatus).

Further, as the target object to be adsorbed of the substrate fixing device of the first embodiment, a glass substrate and the like that are used in a manufacturing process of a liquid crystal panel and the like may be exemplified, in addition to the semiconductor wafer (such as a silicon wafer).

This disclosure further encompasses various exemplary embodiments, for example, described below.

(1) A method of manufacturing a ceramic substrate comprising a base body and an electrical conductor pattern embedded in the base body, the method comprising:

forming, on an upper surface of a green sheet, an electrical conductor pattern by an electrically conductive paste in which cobalt oxide and iron oxide are added to tungsten, an electrically conductive paste in which cobalt oxide and silica are added to tungsten, an electrically conductive paste in which cobalt oxide and manganese oxide are added to tungsten, or an electrically conductive paste in which cobalt oxide and nickel oxide are added to tungsten; and firing the green sheet and the electrical conductor pattern to form the base body and the electrical conductor pattern.

(2) The method according to (1), wherein in the electrically conductive paste, a ratio of each of the cobalt oxide and the iron oxide to the tungsten, a ratio of each of the cobalt oxide and the silica to the tungsten, and a ratio of each of the cobalt oxide and the manganese oxide or a ratio of each of the cobalt oxide and the nickel oxide to the tungsten is 0.1 wt. % or greater and 10 wt. % or less.

What is claimed is:

1. A ceramic substrate comprising:
a base body; and
an electrical conductor pattern embedded in the base body,
wherein the base body is composed of ceramics, and
wherein the electrical conductor pattern has, as a main component, a solid solution having a body-centered cubic lattice structure in which cobalt and iron are solid-dissolved in tungsten, a solid solution in a body-centered cubic lattice structure in which cobalt and silicon are solid-dissolved in tungsten, a solid solution having a body-centered cubic lattice structure in which cobalt and manganese are solid-dissolved in tungsten, or a solid solution having a body-centered cubic lattice structure in which cobalt and nickel are solid-dissolved in tungsten.

2. The ceramic substrate according to claim 1, wherein a main component of the base body is aluminum oxide.

3. The ceramic substrate according to claim 2, wherein the base body has a purity of the aluminum oxide of 99.5% or higher.

4. The ceramic substrate according to claim 2, wherein the base body has a relative density of 97% or greater with respect to aluminum oxide.

5. The ceramic substrate according to claim 2, wherein the base body has an average particle diameter of the aluminum oxide of 1.0 μm or greater and 3.0 μm or smaller.

6. The ceramic substrate according to claim 1, wherein in the electrical conductor pattern, an average particle diameter of the tungsten is 0.5 μm or greater and 3.0 μm or smaller.

7. A package for a semiconductor device comprising the ceramic substrate according to claim 1.

8. An electrostatic chuck comprising an electrostatic electrode, wherein the electrical conductor pattern of the ceramic substrate according to claim 1 is the electrostatic electrode.

9. A substrate fixing device comprising:
a base plate; and
the electrostatic chuck according to claim 8 mounted on one surface of the base plate.

10. The ceramic substrate according to claim 1, wherein the electrical conductor pattern has, as the main component, the solid solution having the body-centered cubic lattice structure in which cobalt and iron are solid-dissolved in tungsten, or the solid solution having the body-centered cubic lattice structure in which cobalt and manganese are solid-dissolved in tungsten.

11. The ceramic substrate according to claim 10, wherein the electrical conductor pattern has, as the main component,
   the solid solution having the body-centered cubic lattice structure in which cobalt and iron are solid-dissolved in tungsten and a ratio of cobalt and iron to tungsten is 0.05 wt. % or greater and 10 wt. % or less, or
   the solid solution having the body-centered cubic lattice structure in which cobalt and manganese are solid-dissolved in tungsten and a ratio of cobalt and manganese to tungsten is 0.05 wt. % or greater and 10 wt. % or less.

12. The ceramic substrate according to claim 1, wherein the electrical conductor pattern has, as the main component,
   the solid solution having the body-centered cubic lattice structure in which cobalt and iron are solid-dissolved in tungsten and a ratio of cobalt and iron to tungsten is 0.05 wt. % or greater and 10 wt. % or less, the solid solution in the body-centered cubic lattice structure in which cobalt and silicon are solid-dissolved in tungsten and a ratio of cobalt and silicon to tungsten is 0.05 wt. % or greater and 10 wt. % or less, the solid solution having the body-centered cubic lattice structure in which cobalt and manganese are solid-dissolved in tungsten and a ratio of cobalt and manganese to tungsten is 0.05 wt. % or greater and 10 wt. % or less, or the solid solution having the body-centered cubic lattice structure in which cobalt and nickel are solid-dissolved in tungsten and a ratio of cobalt and nickel to tungsten is 0.05 wt. % or greater and 10 wt. % or less.

\* \* \* \* \*